THIN-FILM CIRCUIT ARRANGEMENT

Filed Aug. 21, 1961 4 Sheets-Sheet 1

INVENTOR
RICHARD L. GARWIN

BY [signature]
ATTORNEY

United States Patent Office 3,184,674
Patented May 18, 1965

3,184,674

THIN-FILM CIRCUIT ARRANGEMENT

Richard L. Garwin, Scarsdale, N.Y., assignor to International Business Machines Corporation, New York, N.Y., a corporation of New York Filed Aug. 21, 1961, Ser. No. 132,961
17 Claims. (Cl. 323—44)

This invention relates to a transformer for electromagnetic energy, and more particularly to a transformer for coupling electrical signals, which extend over an extremely wide range of frequencies, from a thin-film circuit formed on one plane to one or more thin-film circuits formed on one or more other planes.

With the advent of complex large-scale electrical systems, as exemplified by present day calculators and computers by way of example, the physical size of these systems has markedly increased when conventional electric circuit components are employed. Further, the power consumed and the heat liberated has increased to the point where it is generally necessary to employ air-conditioning equipment to permit the electrical system to operate in an environment maintained at conventional temperatures.

For the above reasons, and due to the fact that such systems are advancing to yet more complex designs, new and novel electric circuit components, as well as entire electric circuits themselves, are being developed which feature, simultaneously, both a major reduction in physical size together with reduced power consumption. The term microminiaturization has broadly been applied to this class of electrical circuits and components. Although many parallel development programs are presently being pursued by a large number of investigators, a general class of microminaturized circuitry includes at least a plurality of planar strip conductors insulated from and supported above a planar conductive ground plane, with a number of such planes interconnected to form a complete assembly or subassembly. An important problem arises, however, when attempts are made to interconnect the various circuit planes. First, because of the minute physical size of microminiature circuits, it is difficult to solder, weld, or otherwise affix connecting leads to the planes which have sufficient rigidity to ensure reliable connections. Secondly, the leads so affixed are characterized by a magnitude of inductance appreciably greater than the inductance of the interconnected microminiature circuits, thereby materially decreasing the operating speed of the assembled circuit. Finally, transmission line connections have additionally proved difficult since it is necessary to affix at least a pair of leads at each terminal to be connected, and, further, the circuit impedances being connected are generally of such a low value that conventional transmission lines, which exhibit this characteristic impedance as is necessary to obtain optimum transmission of the electromagnetic energy, have additionally proved difficult to fabricate.

According to this invention, however, there is provided a novel transformer which takes particular advantage of the characteristics of microminiature circuits and components to attain an efficient transfer of energy over a band of frequencies hithereto unavailable. Moreover, the use of this interplane coupler is effective to transfer energy between one or more planes without the necessity of connecting wires or transmission lines between the planes. Further, as described in a preferred embodiment hereinafter, the phenomenon of superconductivity may also be employed in the novel interplane coupler to extend the frequency range down to zero c.p.s., that is the transformer is also effective to couple D.C. energy.

Briefly, the transformer of the invention consists of conventional primary and secondary circuitry wherein a novel geometric configuration is employed for coupling energy from relatively low frequencies, which can extend to D.C., to well over 10 kmc. The coupler is particularly adaptable, without modification, to those microminiature circuits which include a narrow thin-film strip conductor insulated from a planar shield or ground plane or, more generally, low-impedance microminiature strip lines. At the point of coupling, a portion of the ground plane is removed to increase the inductance of the coupling portion of the primary circuit. To complete the coupler, in juxtaposed position, similar geometry, which is a mirror image of the primary circuit, is employed for the secondary circuit. By proper dimensioning of the spacing between planes, as well as the width of the thin films, at least 95% of the current in the primary circuit is caused to flow in the secondary circuit. Further, by fabricating the thin films of superconductive materials and operating the planes at a superconductive temperature, the frequency range of the coupler is extended to D.C.

An object of the invention, therefore, is to provide an improved apparatus for interplane coupling of electromagnetic energy.

Another object of the invention is to provide an improved thin film transformer.

A further object of the invention is to provide an improved D.C. transformer.

Yet another object of the invention is to provide a structure for use in microminiature circuits effective to couple energy between one circuit plane and another circuit plane.

Still another object of the invention is to provide a highly efficient superconductive transformer for coupling energy from zero c.p.s. to over 10 kmc.

A still further object of the invention is to provide an improved wide-band energy coupler.

Yet another object of the invention is to provide an assembly of microminiature circuits which obtains the maximum circuit density per unit volume through the use of novel interplane-couplers.

The foregoing and other objects, features and advantages of the invention will be apparent from the following more particular description of preferred embodiments of the invention, as illustrated in the accompanying drawings.

Figure 5A:
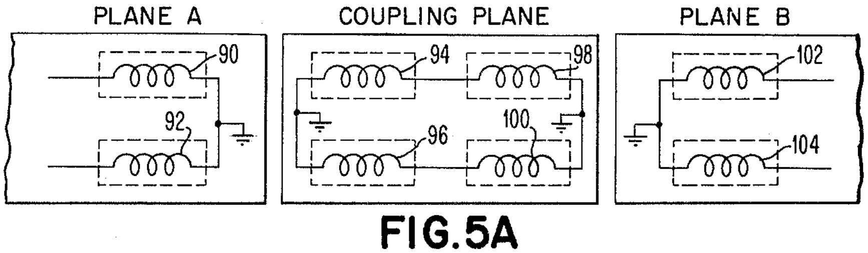
FIG. 5A is a schematic diagram of a further embodiment of the interplane transformer of the invention effective to couple electromagnetic energy between corresponding surfaces of a pair of planes.
Figure 5B:
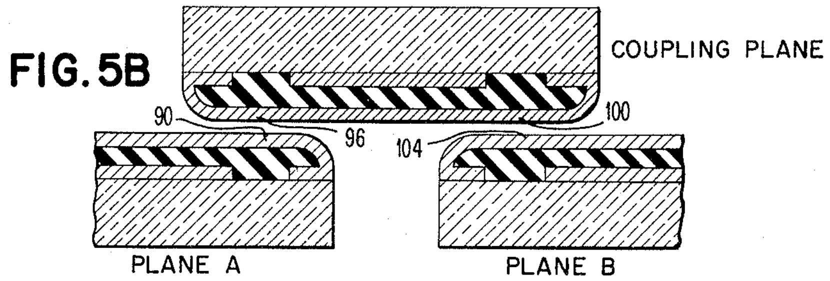

FIG. 5B indicates the relative positioning of the various planes of FIG. 5A.

Figure 6A:
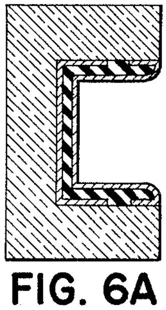
Figure 6B:
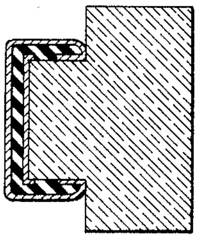

FIGS. 6A and 6B represent still further embodiments of the transformer of the invention.

Figure 6C:
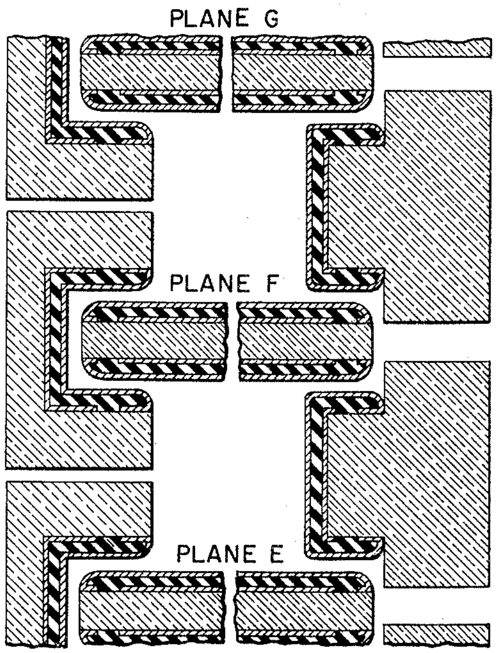

FIG. 6C indicates the relative positioning of the embodiments of FIGS. 6A and 6B for obtaining maximum circuit density per unit volume.

In large-scale complex electrical systems it is desirable to propagate electromagnetic energy from one portion of the system to another at high speed with relatively simple circuitry. As a particular example, but not limited thereto, large-scale superconductive computers presently under development, employ high speed superconductive switching circuits which are fabricated of thin metal films separated from a superconducting shield by a thin insulating film, the complete assembly supported upon a planar substrate. Although it has not been difficult to convey signals from any point on one plane to any other point on the same plane, it has generally proved difficult to convey signal energy from one side of the planar substrate to the other or from one plane to another by any means capable of being driven by standard superconductive circuitry and, further, capable of carrying these signals at rates of 100 m.c.s. or more. As a particular example, representative superconductive circuit lines have a width of $7\times10^{-3}$ cm. spaced 5,000 Angstrom units above the superconducting ground plane. Such a circuit line exhibits a characteristic impedance, $Z_0$, of 1.3 ohms, and circuits formed of these lines exhibit a relatively low value of inductance so that ordinary superconductive switching devices, or cryotrons, can drive them. However, reliable superconductive connections between one or more circuit planes generally introduce such a large value of inductance that the speed at which electrical signals can be propagated from plane to plane is greatly reduced and, further, the heat dissipation is increased as a result of the large amount of energy dissipated to this value of coupling inductance during transient operation. By way of example, the inductance of the particular superconductive circuit line described above is $8\times10^{-11}$ henries per centimeter. Therefore, to avoid introducing a stray inductance equal to the inductance exhibited by 12 centimeters of this superconductive circuit line, a connecting strip transmission line also having a width of $7\times10^{-3}$ centimeters must have a spacing less than $10^{-3}$ centimeters for the 5 millimeters or so that is required between the signal lead and ground lead connections.

The transformer of the invention, however, requires no solder connections and takes full advantage of the high inductance exhibited by a moderate separation of the conductors of a strip transmission line rather than the expected disadvantage resulting from the increased inductance provided thereby. Additionally, the transformer provides the complete elimination of one of the weakest links in modern large scale electrical systems fabricated of microminiature components and circuitry, namely, the complete elimination of connecting contacts.

Figure 1A:
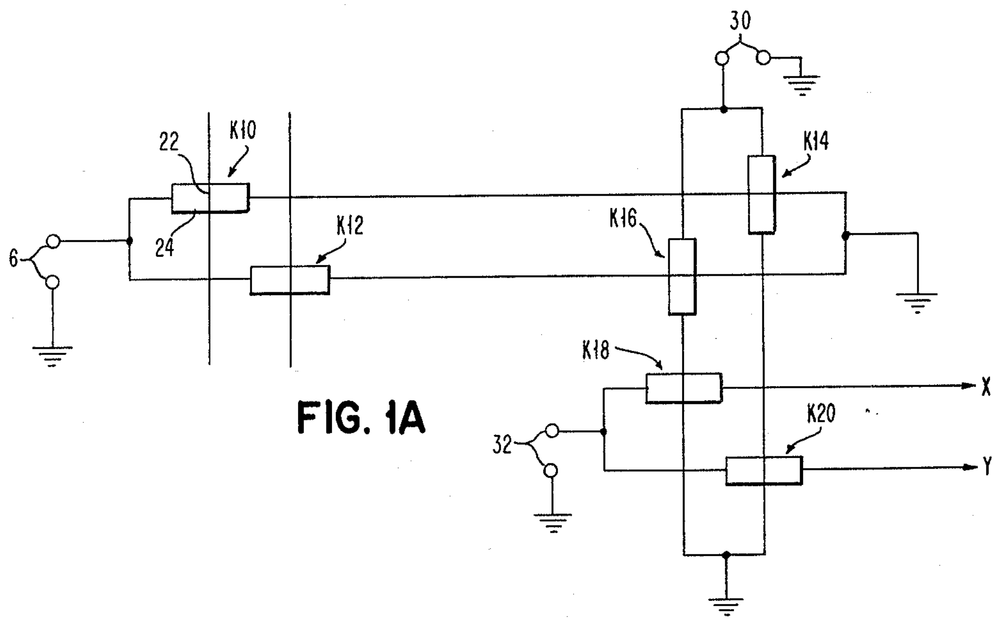
FIG. 1A is a schematic diagram of an elemental superconductive circuit.

Consider now a general superconductive circuit as shown in FIG. 1. As there shown, six cryotrons indicated as K10 through K20 are interconnected to form an elementary superconductive circuit. Each of the cryotrons includes a gate conductor, the resistance of which, either superconducting or normal is determined by the magnitude of current flow through an associated control conductor. Current in any control conductor above a predetermined value, known as the critical control current, is effective to quench superconductivity in the gate conductor associated therewith at the operating superconductive temperature. For example, critical current flow through a control 22 of cryotron K10 quenches superconductivity in an associated gate conductor 24, gate 24 then exhibits normal resistance. At this time, with no current flowing through the control conductor of cryotron K12, current supplied to a pair of terminals 6 flows entirely through the superconducting path provided by the gate conductor of cryotron K12 and the control conductor of cryotron K16, and not through the parallel path including resistive gate conductor 22. Next, this current flow through the control of cryotron K16 quenches superconductivity in its associated gate conductor. At this time, current supplied to a pair of terminals 30 is directed to flow entirely through the superconducting path provided by the gate conductor of cryotron K14 and the control conductor of cryotron K20. Again, current flow through the control conductor of cryotron K20 quenches superconductivity in its associated gate conductor and, therefore, current supplied to a pair of terminals 32 is directed entirely through the gate conductor of cryotron K18 to indicate that a general function, indicated as X, is present. In a similar manner, current supplied to terminal 32 could be caused to flow entirely through the gate conductor of cryotron K20 to thereby indicate the presence of a second general function Y. For a more detailed understanding of superconductive switching devices and logical circuits formed thereof, reference may be had to the volume entitled, "Progress in Cryogenics," volume 1, edited by K. Mendelssohn and published in 1959 by Academic Press, Inc., New York.

Figure 1B:
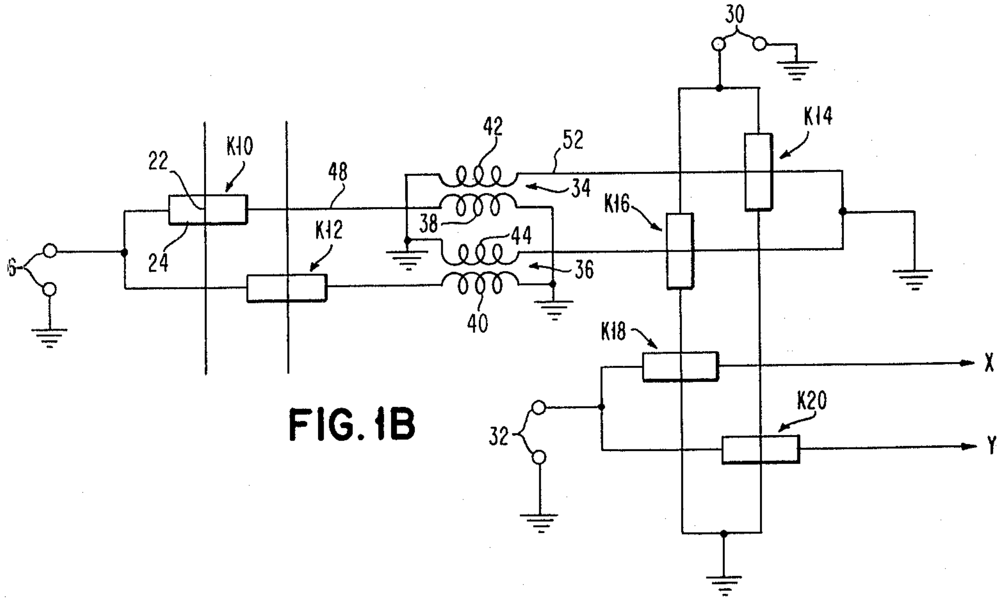
FIG. 1B is a schematic diagram of the circuit of FIG. 1A wherein a first portion of the circuit is formed on one planar support and the remainder of the circuit is formed on another planar support.

For a better understanding of the transformer of this invention, cryotrons K14, K16, K18 and K20 are next considered as formed on a second planar substrate apart from a first substrate which includes cryotrons K10 and K12. One way of coupling the energy between these first and second planes is illustrated in FIG. 1B which employs the same reference numerals as FIG. 1A, where applicable, for reasons of clarity. As shown, the coupling between planes is accomplished by a pair of transformers 34 and 36 each including a primary 38 and 40, and a secondary 42 and 44, respectively. Next, an analysis of the characteristics of transformers 34 and 36 is made in order to determine the necessary transformer geometry. Each of the superconductive circuit lines forming the circuit shown in FIG. 1B, such as lines 48 and 52 by way of example, includes a thin-film strip conductor having a width of $w$ centimeters above a superconducting ground plane and separated therefrom by a distance $t$. Further, it is generally desirable to couple pulses having repetition rates of at least 100 mcs. over circuit loops which include approximately 15 centimeters of the above particular superconductive circuit line. For this reason, line lengths shorter than 15 centimeters are treated merely as lumped inductances in the following development. Variations in the boundary condition outlined above will, of course, require that these assumptions be modified.

Figure 2A:
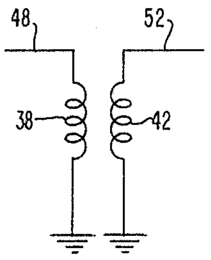
FIG. 2A is a schematic diagram of an ideal transformer.
Figure 2B:
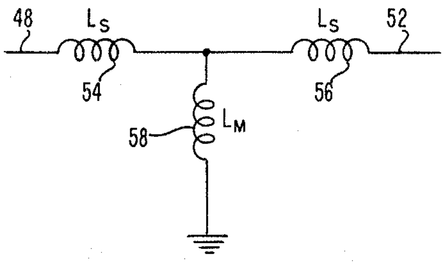
FIG. 2B is an equivalent circuit of the transformer of FIG. 2A.

Referring now to FIG. 2A, there is shown a schematic diagram of transformer 34 including primary 38 connected to line 48 and secondary 42 connected to line 52. From conventional transformer theory, this transformer can be represented by the equivalent T representation shown in FIG. 2B, for unity turns ratio as exhibited by transformer 34 in this case. As is well known, the circuits illustrated in FIGS. 2A and 2B are identical provided that the propagation time through the transformer can be neglected, which is the case in this particular example. Thus, the total primary inductance seen by line 48, when line 52 is open circuited, is given by the following equation:

$$L=L_S+L_M \tag{1}$$

Further, the mutual inductance, defined as the voltage measured on line 52 per unit rate of change of current on line 48, is given by the flux coupling lines 48 and 52, per ampere of current in line 48. With line 52 shorted to ground, the inductance presented to line 48 is given by the following equation:

$$L_{48}=L_S+\frac{L_S L_M}{L_S+L_M}$$

and since, in general, $L_M >> L_S$ $$L_{48} \cong 2L_S \quad (2)$$

Equation 2 shows that the inductance presented to line 48 is equal to twice the stray inductance of the transformer primary for a usable transformer, that is one in which $L_M >> L_S$.

Figure 2C:
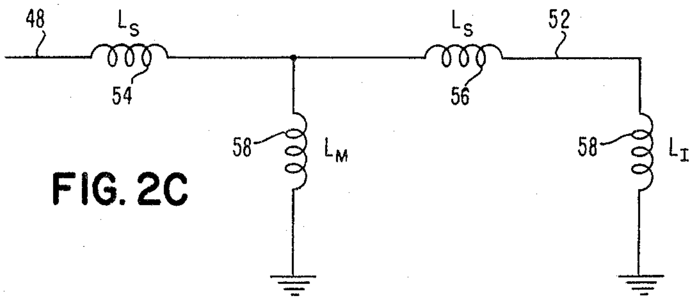
FIG. 2C is an operable representation of the circuit of FIG. 2B.

However, in an actual circuit, line 52 necessarily includes several centimeters of superconductive circuit line having a value of inductance equal to $L_1$. Thus, the complete circuit is indicated in FIG. 2C. Next, consider a current having a value I applied to line 48. The current in line 52 is then given by Equation 3:

$$I_{52} = \frac{I}{\frac{1 + L_1 + L_S}{L_M}} \quad (3)$$

Therefore, to avoid excess loss of current, it is necessary that the condition defined by Equation 4 be satisfied:

$$L_M > L_1 + L_S \quad (4)$$

Under this condition the input impedance, $L_{48}$, of the transformer is defined by Equation 5:

$$L_{48} \leqq 2L_S + L_1 \quad (5)$$

Further, in order to maintain rapid coupling of electromagnetic energy the condition defined by Equation 6 must be satisfied:

$$2L_S \leqq L_1 \quad (6)$$

These above two conditions, that is (I) $L_M$ is very much larger than $(L_1 + L_S)$ and (II) $L_S$ is less than $\frac{1}{2}L_1$, together define the required transformer characteristics. It should be noted that the above analysis is merely an engineering design approach rather than a rigorous mathematical treatment. This method of development has been chosen in this description because it is believed to afford a more clear and comprehensive understanding of the invention since the exact analysis includes complex exponential and integral functions. Further, transformers designed according to the above engineering approach differ but slightly in dimensions and characteristics from those designed according to the rigorous treatment.

Figure 3A:
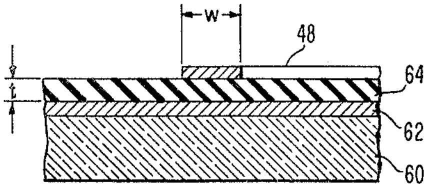
FIG. 3A is a cross sectional view of a portion of a superconductive circuit line employed in the circuit of FIG. 1B.

The above two conditions are now sufficient to determine the geometry of the interplane coupler of the invention. Referring to FIG. 3A, there is shown in cross sectional view a section of superconductive circuit line, such as line 48 of FIG. 1B by way of example. As there shown, the various elements of the line are supported upon an insulating substrate 60 which may be glass, quartz, or the like. Contiguous with substrate 60 is a superconducting ground plane 62 fabricated of a hard superconductive material, that is, a material which remains superconducting at the superconductive operating temperature for all values of magnetic field encountered during circuit operation. Generally, layer 62 is approximately 2,000 to 3,000 Angstrom units in thickness, although wide variations from this value may be employed as required. Next, an insulating layer 64, which generally is about 5,000 Angstrom units in thickness, is employed to insulate the ground plane from the circuit lines. This insulating layer is illustrated in the drawings as having a thickness *t*. Supported on this insulating layer is thin-film strip conductor 48 of the superconductive circuit line. Generally this thin-film strip has a thickness of approximately 1,000 Angstrom units and a width, indicated in the drawings as *w*, which may be about $7 \times 10^{-3}$ centimeters as indicated above. Finally, a second insulating layer is generally employed to overlay the circuit but for reasons of clarity as will be understood as the description proceeds is not illustrated herein. It should be noted that strip 48 is also fabricated of a hard superconductive material except for those portions of the strip which function as the gate conductor of the superconductive switching devices. That is, the circuit lines include short portions of a soft superconductive material, such as gate conductor 24, which are normally superconducting at the superconductive operating temperature and wherein superconductivity is selectively quenched under the influence of the magnetic field generated by the critical control current.

Consider now characteristic (I) one above. It is seen that, under open circuit conditions, the self-inductance of the superconductive circuit line 48 must be greatly increased at the coupling portion so that most of the flux links line 52 in FIG. 2C. This is easily and readily accomplished in the structure shown in FIG. 3A by removing a portion of ground plane 62 in the coupling area. It has been found convenient that an approximately rectangular region of the ground plane be removed, as more particularly hereinafter described.

Figure 3B:
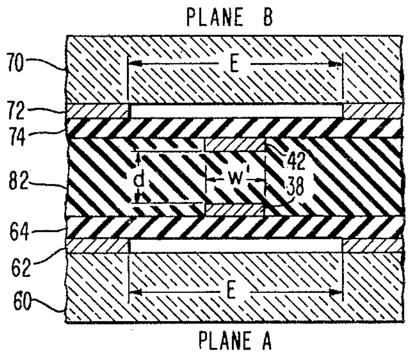
FIG. 3B is a cross sectional view of a first embodiment of the transformer of the invention as used in the circuit of FIG. 1B.

Referring now to FIG. 3B, there is illustrated a cross sectional view of transformer 34, a first embodiment of the interplane coupler of the invention, wherein corresponding reference numerals are affixed where applicable. As illustrated in FIG. 3B, upon glass substrate 60, ground plane 62 is shown having a portion thereof removed thereby increasing the inductance of primary 38 above the portion of removed ground plane 62. Energy is thereby coupled from primary 38 to a corresponding secondary 42 positioned a distance *d* thereabove. It should be noted that efficient transfer of energy is accomplished by having plane B, the coupled plane, a mirror image of plane A, the driving plane. Referring now to plane B, it is seen that this plane also includes a substrate 70, a ground plane 72 and insulating layer 74 and further that a corresponding portion of ground plane 72 is also removed to increase the inductance in secondary 42. In FIG. 3B primary 38 and secondary 42 are separated a distance *d* and each of the ground planes are removed through a width E. Space *d* is shown as determined by an insulating layer 82 as more particularly described hereinafter. Further to render the following development more general, strips 38 and 42 have an indicated width *w'*, which in the special case is equal to *w*. That is, in the special case the width of both primary 38 and secondary 42 is equal to the width of circuit line 48.

Next, the following properties of transformer 34 are calculated wherein primary 38 and secondary 42 each have a length equal to X. For the structure shown, the value of $L_S + L_M$ is given by Equation 7:

$$L_S + L_M \cong \frac{4\pi X w'}{2w'} \cong 2\pi X \quad (7)$$

For the special case, where substrates 60 and 70 each include a further superconducting ground plane on its opposite surface, and the substrate thickness, *s*, is much smaller than *w'*

$$L_S + L_M \cong \frac{4\pi X_s}{2w'} \cong 2\pi \frac{X_s}{w'} \quad (8)$$

Further $L_S$ is defined by Equation 9 as:

$$L_S = \frac{2\pi d X}{w'} \quad (9)$$

Next, the inductance, $L_1$, of a circuit line of length *u*, width *w*, and spaced from the ground plane a distance *t*, driven by secondary 42 is:

$$L_1 = \frac{4\pi u t}{w} \quad (10)$$

Now, with reference to conditions I and II above and rearranging terms, it follows from Equations 7 and 10, that:

$$2\pi X > \frac{4\pi u t}{w}$$

or $$\frac{Xw}{u} > 2t$$

and finally $$\frac{Xw}{uw'} > \frac{2t}{w'} \qquad (11)$$

From condition II defined above, it is necessary that:

$$\frac{2\pi dX}{w'} \leq \frac{2\pi ut}{w}$$

or again rearranging terms Equation 12 follows:

$$\frac{xw}{uw'} \leq \frac{t}{d} \qquad (12)$$

From Equations 11 and 12, it is seen that the spacing between the primary and secondary, $d$, should be less than one half the transformer strip width, $w'$.

Now for a more complete understanding of the above mathematical equations, consider next some illustrative examples of the transfer according to the invention. For the special case wherein $w'$, the transformer conductor width, is equal to $w$, the circuit conductor width, we can choose a spacing of $10^{-3}$ cm. Next, Equation 11 requires that the ratio $X/u$ be greater than $2t/w$ or $1.43\times10^{-2}$ cm. and Equation 12 requires that the ratio $X/u$ be less than or equal to $t/d$ or $5\times10^{-2}$ cm. Thus, we can choose $X/u$ as $5\times10^{-2}$ cm., resulting in the primary and secondary conductor length being $2\times10^{-1}$ cm. to drive a circuit line of 4 cm. As shown in FIG. 3B, the required spacing of $10^{-3}$ cm. or less is obtained by a further insulating coating of Teflon or lacquer. As a second example, the transformer conductor width $w'$ can be chosen about three times the width, $w$, of the circuit conductor or $2\times10^{-2}$ cm., with a primary to secondary spacing, $d$, of $3\times10^{-3}$ cm. Under these conditions the primary and secondary conductor lengths X are equal to $6\times10^{-1}$ cm. in order to drive the before mentioned 4 cm. of circuit line having a width $w$. For each of these examples, the width E (see FIG. 3B) of the openings in the ground planes are preferably about three times $w'$, the width of the transformer conductor strips.

Figures 4A, 4B:
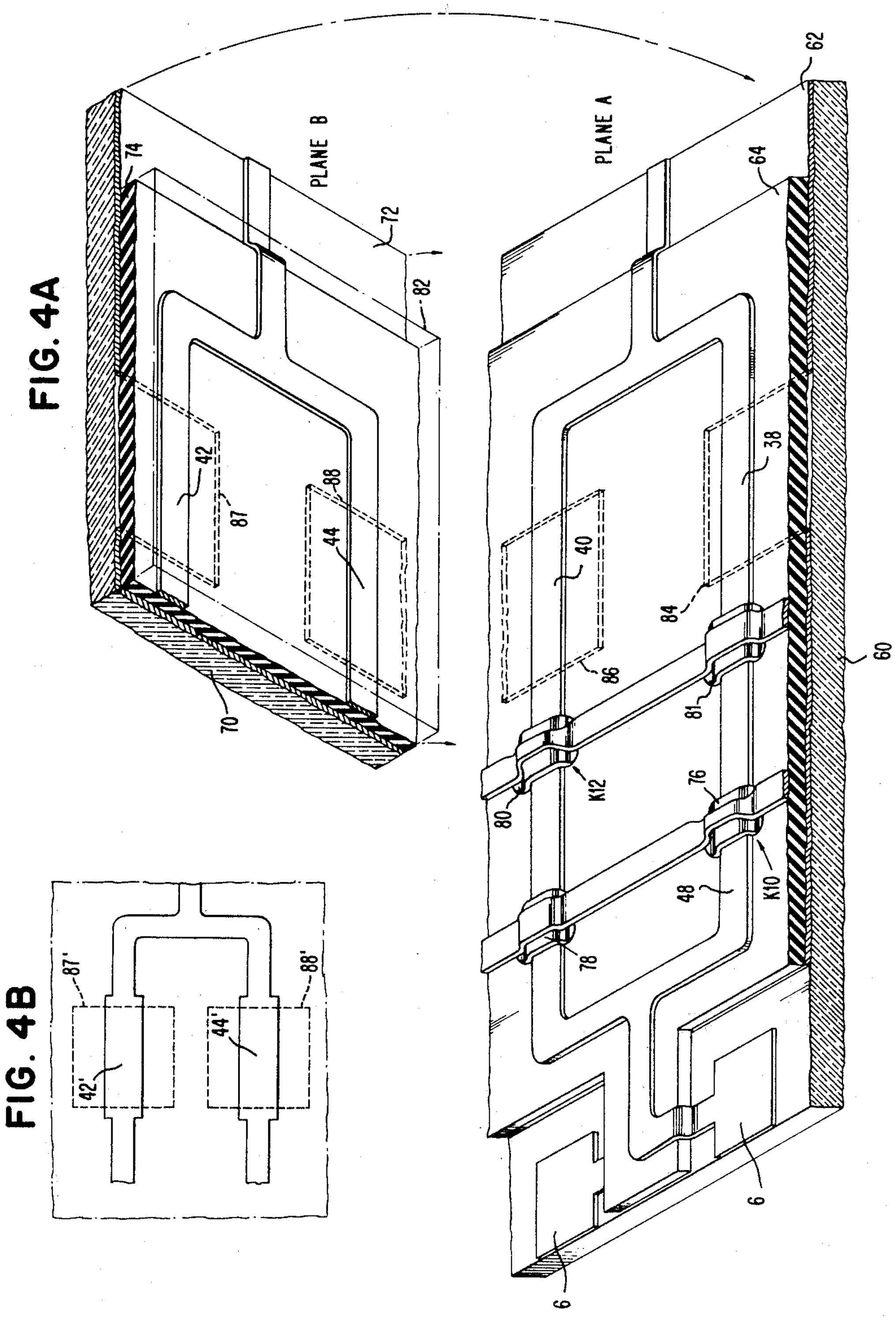
FIG. 4A is a pictorial representation of a portion of the circuit of FIG. 1B.
FIG. 4B is a pictorial representation of another embodiment of the primary of a transformer shown in FIG. 4A.

Referring now to FIG. 4A, there is illustrated a pictorial representation of a portion of the circuit of FIG. 1B, wherein $w'$ is equal to $w$ as in the first example described immediately above. As shown, terminals 6 provide external connections between the circuit and the ground plane; the circuit lines being subsequently connected to the ground plane. The circuit includes a pair of parallel paths, the first including the gate conductor of cryotron K10, strip 48, and primary 38 of transformer 34, and the second including the gate conductor of cryotron K12 and primary 40 of transformer 36. As indicated in the drawing, and as may best be understood with reference again to FIGS. 3A and 3B, which are cross sections of strip 48 and transformer 34, this circuitry is formed on substrate 60 upon which is positioned a ground plane 62. Above this ground plane is positioned insulating plane 64 upon which the circuit conductors are formed. As described above, the ground plane and the circuit conductors are fabricated of hard superconductive material, except for those portions of the circuit conductors which provide the gate conductors of the cryotrons of the circuit. Further, four regions of insulating material 76, 78, 80, and 81 are positioned above the various portions of the superconductive circuit lines which are crossed by further conductive layers. These crossings are required to provide current paths for the control conductors of cryotrons K10 and K12. Since this portion of circuit fabrication forms no portion of the present invention, further information may be had with reference to U.S. Patent 2,966,647 issued December 27, 1960, to J. J. Lentz wherein circuits of this type are more particularly described. Referring now to the primaries of transformers 38 and 40, it can be seen that they are fabricated of the same width, $w$, as the circuit line, which, in the above particular example, was chosen as $7\times10^{-3}$ centimeters. Below these primary windings, openings in the ground plane, indicated by dotted regions 84 and 86, are positioned to increase the inductance as defined above. These openings are approximately 0.2 millimeter wide, that is about 3 times width $w$, and 2 millimeters long as determined above. It is, of course, apparent, also with reference to FIGS. 3A and 3B, that the mirror image secondaries 42 and 44 are positioned immediately above windings 38 and 40, as indicated in FIG. 4A. Secondaries 42 and 44 in the mirror image plane are separated from windings 38 and 40 by approximately $10^{-3}$ centimeters as derived above, and positioned below corresponding openings in ground plane 72, indicated as 87 and 88, also being 0.2 millimeter wide and 2 millimeters long. The second example described above, wherein the width of the transformer conductors, $w'$, is wider than the width, $w$, of the circuit conductors is illustrated in FIG. 4C, which shows the transformer secondary only. Width $w'$ of primaries 38' and 40' are now increased to $20\times10^{-3}$ centimeters, and, as stated, the length of the transformer conductors is 6 mm. The ground plane openings 84' and 86' have a width $6\times10^{-2}$ cm. and a length of 6 mm., and the spacing, $d$, between the primaries and secondaries (not shown) is $3\times10^{-3}$ cm. It is now apparent that various other dimensions can be employed without departing from the invention, as briefly further described below.

In the embodiments described above the transformers are effective to couple energy between opposite surfaces of adjacent planes, that is, from an upper surface of a first plane to the lower surface of a second plane. A further embodiment of the invention is next illustrated in FIG. 5A wherein energy is coupled between corresponding surfaces of adjacent planes. As shown therein, the circuitry on plane A, as well as plane B, can, by way of example, be similar to that shown in FIG. 4A. An auxiliary coupling plane is then employed to transfer energy from the upper surface of plane A to the upper surface of plane B. This is accomplished by coupling energy from a pair of primaries 90 and 92 in plane A to a corresponding pair of secondaries 94 and 96, respectively, located on the auxiliary coupling plane. Secondaries 94 and 96 are then effective to drive a further pair of primaries 98 and 100, also located on the auxiliary coupling plane. The latter primaries are next effective to couple energy to a further pair of secondaries 102 and 104 located on plane B, respectively. The relative positioning of plane A, plane B, and the auxiliary coupling plane is indicated in FIG. 5B wherein the circuit portion of each of the planes is generally indicated in the manner of FIG. 3B.

Further embodiments of the invention are next illustrated in FIGS. 6A and 6B, each of which show various modifications of the auxiliary coupling plane of FIG. 5A. FIG. 6A illustrates an auxiliary coupling plane effective to couple energy from a first surface of a plane to a second surface of the same plane. Correspondingly, FIG. 6B indicates an auxiliary coupling plane effective to transfer energy from a first surface of one plane to a second surface of another plane. Again, the circuit portion of each of the couplers in FIGS. 6A and 6B is generally indicated in the manner of FIG. 3B. Referring now to FIG. 6C, a plurality of each of the couplers shown in FIGS. 6A and 6B are employed to couple energy between a number of stacked planes wherein the maximum circuit density per unit volume is obtained by including circuits on each face of a substrate. It should now be understood that through various combinations of the auxiliary coupling planes illustrated in FIGS. 5A, 6A, and 6B, as well as modifiactions thereof, various coupling arrangements can be employed to form a desired arrangement of circuit planes.

Note should be made of the fact that a feature of the transformer of the invention is the coupling of electrical energy over a wide band of frequencies. Although the transformer has been described with particular reference to superconductive circuits, this has been done for descriptive purposes only, it being understood that the transformer has general utility as an energy coupler in conventional thin film microstrip circuits, while still exhibiting the broad band and high efficiency characteristics of the device. The extension of the low frequency response to also include D.C. is obtained by employing the phenomenon of superconductivity, that is the apparent absence of electrical resistance exhibited by various materials below predetermined critical temperatures. It is necessary in order to couple D.C. energy that the entire secondary circuit be completely superconducting. Since the net flux threading a superconducting loop cannot be changed, a magnetic field coupled thereto induces a circulating current which generates an opposing magnetic field to maintain the net flux constant. It is convenient, although not required, that the primary circuit also be superconducting. The phenomenon of inductive coupling of D.C. currents is now well known in the cryogenic arts. Patent No. 2,987,631 of E. C. Park, Jr., describes the operational theory of such D.C. transformers. The extreme high frequency response is exhibited as a result of the small size together with the low circuit impedance. Further, through a proper choice of parameters, the length of the primary and secondary conductors can be only a fraction of a wavelength of the highest frequency to be coupled.

Note also should be made of the fact that the transformer of the invention is readily adaptable to be fabricated by the same technique as is employed to fabricate the remainder of the circuit, which may be by way of example, that of vacuum evaporation. In this manner, complex microminiature multilayer circuits are advantageously fabricated in quantity wherein the novel transformers, rather than coupling energy between planes or surfaces of a plane, are employed to couple energy between various layers formed on a single plane.

In addition to the various embodiments and circuits shown and described above, almost limitless variations are possible. Referring again to FIG. 5B, auxiliary coupling planes of the invention may be utilized to perform logical operations. As a specific example, consider a first complex logical expression, M, generated on plane A and a second complex logical expression, N, generated on plane B. By proper design of the circuitry on the auxiliary coupling plane, the outputs of plane A and B are coupled thereto and loigcally combined to develop, upon the coupling plane, the desired logical function. More generally stated, the auxiliary coupling plane shown in FIG. 5B can also be a circuit plane. By selectively positioning a number of planes in the position shown, various logical functions can be generated. Thus, a first plane is employed to generate the logical AND function of the variables M and N, a second plane for the EXCLUSIVE OR, etc. Again, impedance and current transformations are provided by connecting the first conductors of a plurality of transformers in series and the second conductors of the plurality of transformers in parallel. Thus, a unit value of current flow through the first conductors results in a plurality of unit current values delivered by the parallel connected second conductors. Conversely, a plurality of unit current values delivered to the parallel connected second conductors results in a unit value of current flow through the first conductors. Again, by this current transformation, various logical functions can be generated. Finally, note should be made of the fact that the various thicknesses and dimensions shown in the drawing have not been made to any particular scale but have been selectively enlarged to show details as necessary. Further, the means and apparatus for maintaining superconductivity in the circuits as required, that is a temperature close to absolute zero, have neither been shown nor described since these are well known to those skilled in the art.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A microminiature thin-film microstrip transmission line circuit comprising; at least first and second circuit portions; a segment of the strip conductor of the transmission line of said first portion extending in parallel relationship with a segment of the strip conductor of the transmission line of said second portion; ground planes associated with each of said transmission lines and areas of said ground planes being removed adjacent the parallel segments of said transmission lines.

2. A thin-film transmission line circuit comprising; at least first and second portions; said first portion including a first strip conductor of predetermined width, a dielectric, and a conducting ground plane; said second portion including a second strip conductor of said predetermined width, a dielectric, and a conducting ground plane; said first and second portions having first and second segments, respectively, extending in longitudinal parallel relationship with a major face of said first strip conductor being separated from a major face of said second strip conductor by a further dielectric; said further dielectric having thickness less than said predetermined width; and regions of said conducting ground planes of said first and second portions being removed adjacent said first and second segments.

3. The circuit of claim 2 wherein said second strip conductor is a part of a superconducting loop.

4. The circuit of claim 3 wherein said conducting ground plane of said second portion is superconducting.

5. A superconductive circuit arrangement comprising; a first circuit including at least a first planar superconductive strip conductor spaced apart from a first superconducting ground plane; a second circuit including at least a second planar superconductive strip conductor spaced apart from a second superconducting ground plane; a portion of said first and second strip conductors being longitudinally parallel one to another; said portions of said first and second strip conductors spaced apart a predetermined distance; and regions of said first and second superconducting ground planes being absent adjacent said portions of said first and second strip conductors.

6. A superconductive transformer comprising; a superconductive primary; a superconductive secondary; said primary and said secondary each including a planar strip of superconductive material spaced apart and insulated from a superconductive magnetic ground plane; means positioning said primary and said secondary in spaced vertical and longitudinal horizontal alignment; means supplying current to said primary; and said primary and said secondary each including a portion of said ground plane adjacent said planar strip which is ineffective to shield magnetic fields.

7. The transformer of claim 6 includes means maintaining said transformer at a temperature below a superconductive temperature.

8. The transformer of claim 6 including means maintaining said transformer at a temperature above a superconductive temperature.

9. A thin-film circuit arrangement comprising; a first circuit including at least a first thin-film conductor insulated from a first ground plane; a second circuit including at least a second thin-film conductor insulated from a second ground plane; and means coupling electromagnetic energy between said first and second circuits including means positioning a portion of said first and second thin-film conductors longitudinally parallel one to another, and areas of said first and second ground planes being removed adjacent said portions of said first and second thin-film conductors to enhance the transfer of energy between said first and second circuits.

10. A superconductive circuit arrangement comprising first, second, and third superconductive circuit planes; said circuitry on each of said planes including a plurality of superconductive planar strip conductors insulated from a common superconducting ground plane means positioning all of said planes in vertical stacked alignment; and further means coupling energy between said circuit planes including input and output regions on each of said circuit planes, said input and output regions having at least one of said strip conductors positioned above an aperture in said ground plane, a plurality of auxiliary coupling planes each including further input and output regions, each of said further input and output regions having a superconductive planar strip conductor positioned above an aperture in a superconducting ground plane, and means positioning the input region of each of said coupling planes adjacent the output region of one of said circuit planes and the corresponding output region of each of said coupling planes adjacent the input region of another of said circuit planes.

11. A superconductive circuit arrangement comprising; a first circuit including at least a first superconductive strip conductor spaced apart from a first superconducting ground plane; a second circuit including at least a second superconductive strip conductor spaced apart from a second superconducting ground plane; said first and second strip conductors having a predetermined width; a portion of said first and second strip conductors spaced longitudinally parallel and separated by a distance less than said predetermined width; and said first and second superconducting ground planes including apertures adjacent said portions of said first and second strip conductors, each of said apertures having a width about three times said predetermined width and a length determined by said second circuit, whereby current supplied to said first superconductive strip conductor is coupled to said second superconductive strip conductor.

12. A transformer for coupling electromagnetic energy from a first circuit to a second circuit over an extended frequency range comprising; a primary element and a secondary element; said primary element including a first thin-film strip conductor spaced apart from a first electrically conductive ground plane; said secondary element including a second thin-film strip conductor spaced apart from a second electrically conductive ground plane; means coupling said primary in series with said first circuit; means coupling said secondary in series with said second circuit; means positioning a portion of said first and second strip conductors in parallel spaced relationship; said first and second ground planes adjacent said portions of said first and second strip conductors having apertures therein, said means positioning said strip conductors being further effective to align said apertures one to another; and the dimensions of said apertures determining the quantity of energy coupled from said first to said second circuit.

13. The transformer of claim 12 wherein said second circuit and said secondary element are superconducting whereby the low frequency range of said transformer is extended down to and includes D.C.

14. Apparatus for coupling energy from a thin-film circuit formed on a first plane to a thin-film circuit formed on a second plane comprising; a third thin-film circuit plane; said third plane including a thin film electrically conductive ground plane, a plurality of thin-film conductors insulated from said ground plane, and input and output regions, said input and output regions consisting of at least one of said thin-film conductors spaced above an aperture in said ground plane; said circuits formed on said first and second planes having predetermined coupling regions; each of said coupling regions including a thin-film conductor spaced above an aperture in an electrically conductive ground plane; means positioning the input and output regions of said third plane adjacent the coupling regions of said first and second planes, respectively; and said positioning means being further effective to align the strip conductors of said input and output regions parallel with said strip conductors of said coupling regions and spaced apart a predetermined distance determined by the width of said strip conductors of said input, output, and coupling regions.

15. A superconductive transformer effective to couple electrical current from a first circuit to a second superconductive circuit comprising; a primary; a secondary; said primary including a planar conductor of width $w'$ spaced above a conducting ground plane a distance $t$, said conducting ground plane having an aperture centered beneath said planar conductor of width $3w'$ and length X; said secondary including a planar superconducting conductor of width $w'$ spaced above a superconducting ground plane a distance $t$, said superconducting ground plane having an aperture centered beneath said planar superconducting conductor of width $3w'$ and length X; means connecting said primary in series with said first circuit and said secondary in series with said second circuit; said second circuit including a planar superconducting conductor of width $w$ and length $u$ spaced above a superconducting ground plane a distance $t$; and means positioning said primary and secondary in vertical spaced relationship with each of said apertures in alignment one to another and said planar conductor and said planar superconducting conductor separated by a distance equal to or less than one half the width $w'$.

16. The transformer of claim 15 wherein $w'$ is equal to $w$.

17. A microstrip transmission line transformer; said transformer including a primary and a secondary; said primary and said secondary each consisting of a thin-film strip conductor spaced above a rectangular aperture in a conductive ground plane; and said primary strip conductor and said secondary strip conductor being coupled magnetically in the areas adjacent said apertures.

References Cited by the Examiner

UNITED STATES PATENTS

| | | | |
|---|---|---|---|
| 2,938,160 | 5/60 | Steele | 323—94 |
| 2,949,602 | 8/60 | Crowe | 340—173.1 |
| 2,966,647 | 12/60 | Lentz | 307—88.5 |

FOREIGN PATENTS

| | | |
|---|---|---|
| 602,495 | 7/60 | Canada. |

OTHER REFERENCES

IBM Journal, October 1957, pages 295 to 303, "Trapped-Flux Superconducting Memory," J. W. Crowe.

LLOYD McCOLLUM, *Primary Examiner.*

ROBERT L. SIMS, *Examiner.*